Sept. 3, 1968 F. HOLTZBERG ET AL 3,400,350

SUPERCONDUCTOR MATERIALS AND DEVICES

Filed April 26, 1965 2 Sheets-Sheet 1

*INVENTORS*
FREDERIC HOLTZBERG
SIEGFRIED I. METHFESSEL

BY John E. Dougherty Jr.
ATTORNEY

3,400,350
SUPERCONDUCTOR MATERIALS AND DEVICES

Frederic Holtzberg, Pound Ridge, and Siegfried I. Methfessel, Montrose, N.Y., assignors to International Business Machines Corporation, Armonk, N.Y., a corporation of New York Filed Apr. 26, 1965, Ser. No. 450,872
8 Claims. (Cl. 335—216)

ABSTRACT OF THE DISCLOSURE

The superconductive devices to which this application is directed are formed using lanthanum chalcogenide components. These chalcogenides have been found to exhibit superconducting characteristics when at least a minimum number of the metal ion sites are occupied by lanthanum ions. As the number of sites, so occupied, is increased, the critical temperature of the material also increases. For example, $La_2Se_3$ and $La_2S_3$ are not superconducting at 1.3° K. By the addition of lanthanum metal ions to these compounds solid solutions are formed which are Type II superconductors. The critical transition temperature increases as more lanthanum ions are added. The highest transition temperatures are achieved when sufficient lanthanum ions are added to form either $La_3Se_4$ or $La_3S_4$. Superconducting devices such as high field magnets, and superconducting switching circuits, which can also be used as memory devices, are formed using lanthanum chalcogenides of the above-described types as the superconductive components.

The present invention relates to superconductive components and more specifically to such components fabricated of new and improved superconductive materials.

The phenomenon of superconductivity has been the subject of the research and development efforts of increasing intensity in recent years. These efforts have produced new superconductor applications, including high field magnets and superconductive switching and memory circuits, and also a large number of new superconductive materials. Evidence of this latter fact is found in an article entitled "Superconductive Materials and Some of Their Properties," by R. W. Roberts, which appeared in Progress In Cryogenics, vol. 4, pp. 159–217, published in 1964 by Academic Press Inc. This article includes a list of more than 900 known superconductors, a large percentage of which have been discovered in recent years.

The present invention is directed to new superconductive components fabricated out of newly discovered materials. These materials are rare earth chalcogenides, a class in which superconductivity has not heretofore been observed. More specifically, it has been discovered that certain lanthanum chalcogenides are superconductors as are certain solid solutions including these compounds.

For example, though the compounds $La_2Se_3$ and $La_2S_3$ are not superconductors, the crystalline lattice of each of these compounds is of the body centered cubic $Th_3P_4$ type and contains vacancies in the metal ion sites. By the addition of trivalent metal ions to these vacancies, solid solutions are formed which are superconductives. Further, these two compounds are semiconductors and by the addition of the metal ions, the resistivity of the resulting solid solution can be lowered even to the point that they become metallic. It should be pointed out that it is known that certain solid solutions can be formed with predetermined ferromagnetic characteristics altered by the addition to a material having a defect $Th_3P_4$ structure with vacancies in the metal ion sites of another material containing metallic ions which fill these vacancies. This discovery is the subject of application Ser. No. 374,351, filed June 11, 1964, on behalf of F. Holtzberg, T. R. McGuire and S. I. Methfessel and assigned to the assignee of the subject application. However, the above discovery is restricted to solid solutions which include at least one paramagnetic ion per molecule and does not, in any way, suggest the existence of superconductive characteristics in the rare earth chalcogenides of the type to which this application is directed.

It has been further discovered that characteristics of these new superconductors can be varied in accordance with the amount of metal ion added. For example, a solid solution formed by the addition of LaSe to $La_2Se_3$ which is rich in the added metal lanthanum ion and approaches the $La_3Se_4$ compound, exhibits a relatively high superconducting transition temperature and a relatively low resistivity when in the normal state, whereas a solid solution less rich in the added metal ion exhibits a lower superconducting transition temperature and a higher resistivity in the normal state. Another feature of these new materials is that they are Type II superconductors and exhibit the high field characteristics of this class of superconductor which makes them particularly suitable for high field superconducting magnet applications. Because of the nature of the $Th_3P_4$ type crystalline lattice of these materials, the characteristics of the solid solution, superconducting and semiconducting, can be altered by the addition of other metal ions. The newly discovered materials are not only useful in superconducting applications as they are, but as intermediates in the formation of other materials.

Therefore, it is an object of this invention to provide new superconductive devices and components.

Another object of this invention is to provide new superconductive devices and components fabricated of new superconductive materials.

A more specific object of this invention is to provide superconductive devices formed of rare earth chalcogenides which have predetermined superconducting and/or resistivity characteristics.

The foregoing and other objects, features and advantages of the invention will be apparent from the following more particular description of preferred embodiments of the invention, as illustrated in the accompanying drawings.

Figure 1:
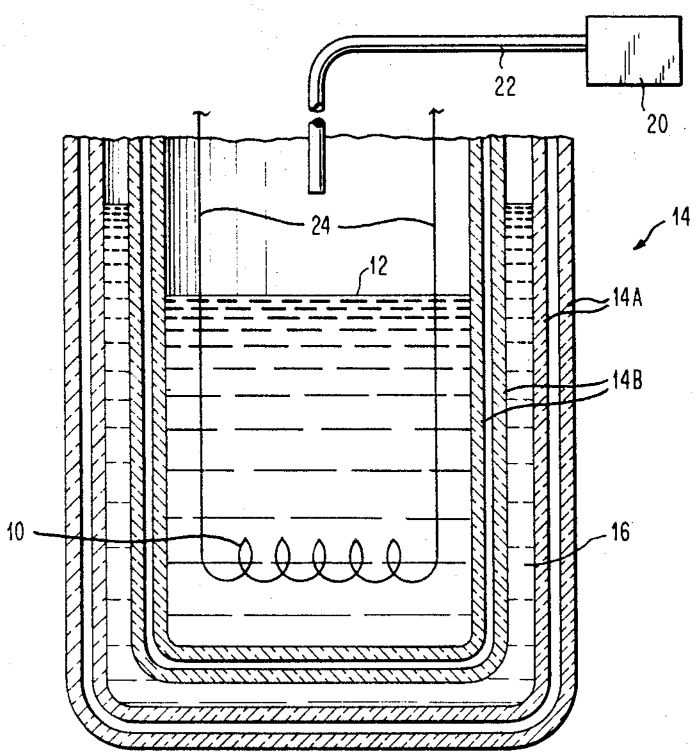
FIG. 1 is a schematic representation of a superconducting magnet immersed in a liquid helium dewar.

Referring now to FIG. 1, there is shown in schematic form, the manner in which a superconductor magnet is operated in a low temperature environment. A superconductive coil shown at 10 is immersed in liquid helium 12 contained within a dewar generally designated 14. This dewar is formed of a pair of outer walls 14A and a pair of inner walls 14B. The space between the inner and outer walls is filled with liquid nitrogen 16 which has a higher boiling point than liquid helium and serves in the overall cooling process to conserve on the amount of liquid helium lost through evaporation.

Liquid helium has a boiling point at atmospheric pressure of 4.2° K. When the environment above the helium is at atmospheric pressure, the temperature of the liquid helium and therefore of the coil 10 is 4.2° K. By controlling the pressure above the liquid helium, its boiling point and therefore the temperature of the bath, can be raised or lowered. This is accomplished by pressure control equipment, generally represented by box 20, which is connected to the portion of the dewar containing the liquid helium through tube 22. When the pressure is raised above atmospheric, the liquid helium temperature rises and when the pressure is lowered below atmospheric, the temperature of the liquid helium bath is lower than 4.2° K.

The superconductive coil 10 is energized by leads 24 which are connected to a power supply not shown. When in use, the field sensitive material or device to be magnetized is placed within the magnetic field of superconductive coil 10. Because of the zero resistance of the coil 10, a very large magnetic field can be generated without heat loss and without the very expensive and bulky cooling equipment which would be required with a nonsuperconducting magnet. The coil 10 must of course, be maintained at a temperature below that at which the material of the coil undergoes a transition to a superconductive state. Further, it is usual to operate these coils at a temperature appreciably below the transition temperature of the material, since it is possible then to carry more current and generate larger fields without approaching the point at which the coil would become resistive by the influence of its own magnetic field.

More detailed structures of the low temperature equipment and of the various methods of mounting the superconductive magnet relative to the material or the device to be magnetized are not shown here, since the details of this structure are well known to those skilled in the art and are not part of the present invention.

It is further pointed out that the superconductive components which are the subject of this invention, may be used in a variety of other low temperature applications, including for example, switching circuits and memory circuits.

Figure 2:
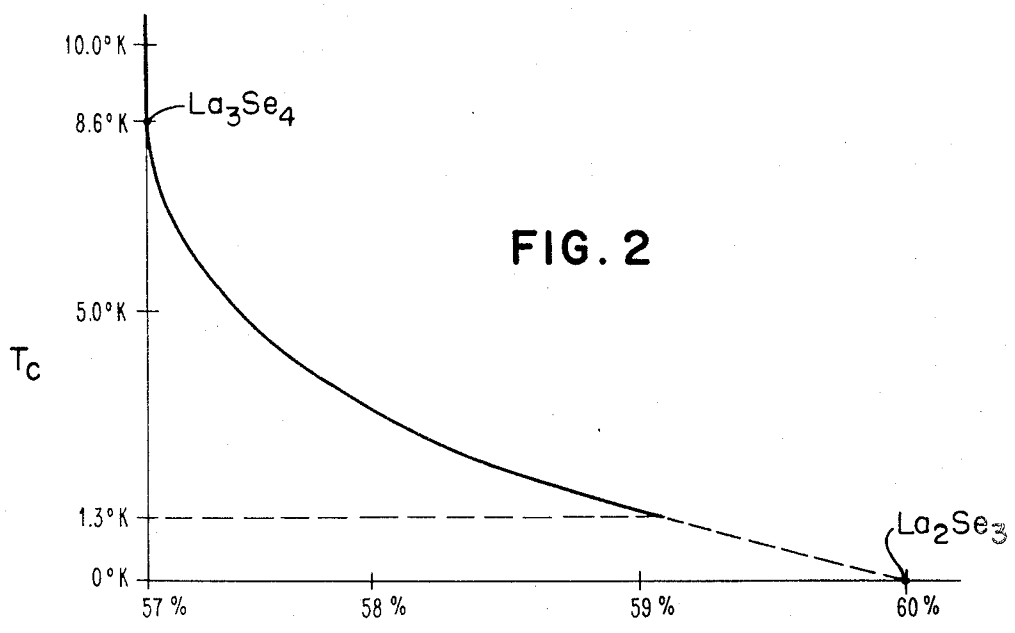
FIG. 2 is a plot showing the form of the relationship between superconductive transition temperature and metal ion concentration for solid solutions between the compositions $La_2Se_3$ and $La_3Se_4$.

There is shown in FIG. 2 a plot of the superconductive transition temperatures $T_c$ of various solid solutions of compounds of the elements lanthanum (La) and selenium (Se), which have the $Th_3P_4$ type crystal structure. The ordinate of the plot represents the transition temperature at which the particular solid solution undergoes a transition from a normal resistive state to a superconductive state in the absence of an applied magnetic field. The abscissa of the plot represents the mole percent of selenium in the particular solid solution. The point .60 at the extreme right of the abscissa represents the compound $La_2Se_3$ which is 60 mole percent selenium. This is a known stable compound and, as is indicated in the drawing, does not exhibit a transition temperature. That is, it is not superconductive at the lowest temperature at which measurements have been made.

A word of caution concerning the presence or absence of superconductive characteristics in a particular material compound or solid solution is required here. When it is stated that a particular material is not superconductive, all that is meant is that it is not superconductive at the lowest temperature at which measurements have been made. It has been hypothesized that all materials will exhibit superconductive properties if the temperature is lowered sufficiently. However, since temperatures below 1.3° K. are extremely difficult to obtain, and the difficulties become greater as it is attempted to lower the temperature further towards "0," the test of the above hypothesis must await further low temperature developments. For the purposes of this invention, it is sufficient to state, as is common in the art, that a particular material is a nonsuperconductor if it does not exhibit superconductive characteristics at the lowest temperature at which measurements have been made, which is about 1.3° K.

With this admonition, it can be stated that the compound $La_2Se_3$ is not a superconductor. However, if a solid solution is formed containing more La by, for example, adding LaSe to the compound $La_2Se_3$, in a manner to be described in detail below superconducting characteristics are observed above 1.3° K. The resulting solid solution systems of the $Th_3P_4$ type structure include the compounds $La_2Se_3$ and $La_3Se_4$ as end members. For a solid solution which contains 59.1% Se, the superconducting transition temperature is 1.3° K. As more LaSe is added to form solutions richer in La, higher transition temperatures can be obtained. For example, a solid solution containing 57.4% Se exhibits a superconductive transition temperature $T_c$ of about 4.2° K. When sufficient LaSe is added to form $La_3Se_4$ (this compound contains 57.1% Se), the superconductive transition temperature is 8.6° K. The addition of further La does not change the superconducting transition temperature. Any La in excess of the composition $La_3Se_4$ cannot be dissolved in the $Th_3P_4$ type crystal lattice and precipitates as a second phase in another crystal structure.

One might speculate fom the fact that the compound $La_2Se_3$ is not a superconductor and the $La_3Se_4$ is a superconductor, that what is observed is the superconductive characteristics of the $La_3Se_4$ in isolated portions of the material. However, this is not the case. The compounds $La_3Se_4$ and $La_2Se_3$ are not separate compounds, but end members of a solid solution system, and each point along the abscissa of FIG. 2 represents a homogeneous solid solution wherein the entire body of material exhibits characteristics unique to that particular solid solution. This homogeneity can be varified by microscopic examination. The $La_2Se_3$ compound crystallizes in a defect $Th_3P_4$ type crystal structure, which includes vacancies in its crystal lattices. These vacancies can be filled by metal ions of proper size. Therefore, wide ranges of solid solubility between the starting compound $La_2Se_3$ and added metal ions are possible. When as above, LaSe is added, having a higher percentage of La than the initial compound, these vacancies are filled by the added La ions. In this way, the electrical conductivity is changed as well as superconducting transition temperatures. Thus, the original and starting compound $La_2Se_3$ is a semiconductor and as solid solutions are formed with more La ions entering the lattice structure, the conductivity increases. Thus, $La_2Se_3$ is a semiconductor and $La_3Se_4$ is a metallic conductor, and the solid solutions depicted in FIG. 2 in the range between these two extremes, have resistivity values between those of the $La_2$ and $Se_3$ and $La_3Se_4$ compounds. Again, it should be emphasized that each solid solution with a specific concentration is unique wherein the different characteristics for different concentrations are those of the entire body of material as a whole.

A further point of importance to be noted is that the starting $La_2Se_3$ compound with the defects in its lattice can have these vacancies filled by the addition of metal ions other than La to obtain a solid solution having predictable characteristics. Such other metal ions may be added instead of or in addition to, the La ions and many, as the La ions, have a size such that the crystalline lattice size is unchanged. Ions having different sizes may be added to produce changes in lattice constants which together with the changes in conductivity, affect the overall electrical characteristics of the resulting solid solution. Thus, though it is apparent that the solid solutions described above and represented as having the specific superconductive transition temperatures shown in FIG. 2 may be used in superconductive magnet applications of the type shown in FIG. 1 as well as in other types of superconductive devices mentioned above, it is also true that these solid solutions can be used as starting points in forming more complicated solid solutions wherein the overall characteristics are further modified by the addition of other ions to fill the vacancies in the crystalline lattice.

Figure 3:
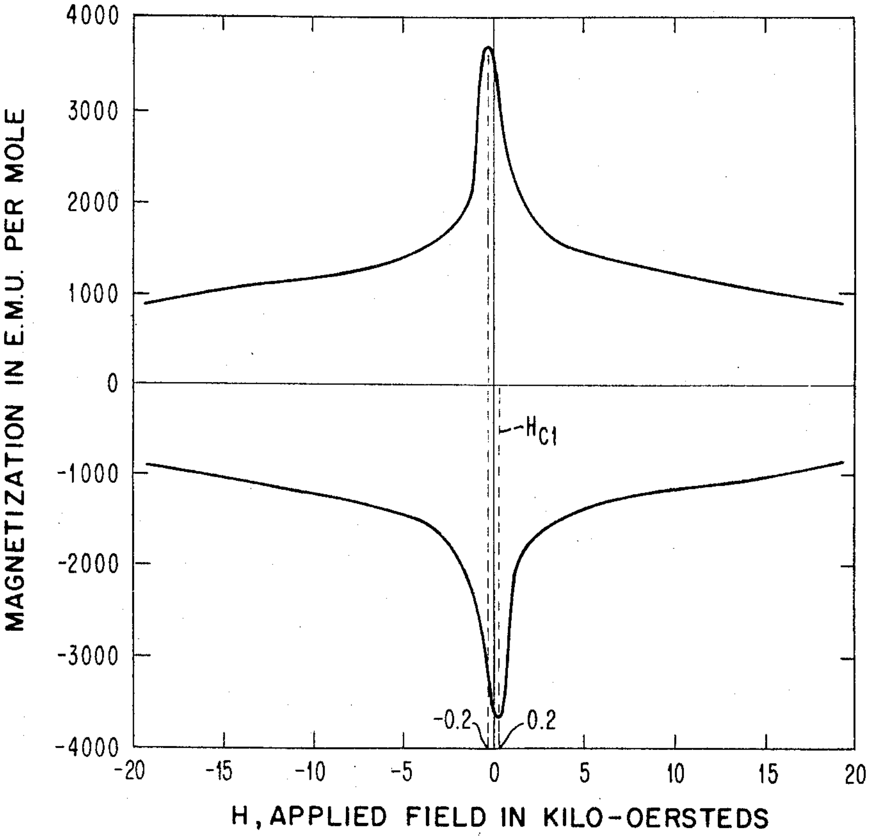
FIG. 3 is a plot exhibiting the magnetic characteristics of the superconductor $La_3Se_4$ at 1.25° K.

The characteristic properties of the superconductive materials of the type to which the subject application is directed are further demonstrated in the plot of FIG. 3. This plot is obtained by suspending an essentially spherical sample of the material in an environment at a temperature below its superconducting transition temperature and measuring the magnetic susceptibility with a pendulum magnetometer for several different applied magnetic fields. In the plot of FIG. 3, the applied field is represented along the abscissa and the magnetization along the ordinate. This type of test has the advantage of demonstrating that the superconductive characteristics of the sample are not produced by a localized phase within the sample but are the characteristics of the body of material as a whole. Curves of the type shown in FIG. 3 can be obtained for all of the solid solutions described above with reference to FIG. 2 at temperatures below their transition temperatures. The curve of FIG. 3 is for a sample in which all of the vacancies in the starting $La_2Se_3$ compound have been filled so that the material is entirely the $La_3Se_4$ compound. The characteristics of this material are shown since it exhibits the highest transition temperature $T_c$ of 8.6° K. and also is capable of carrying larger currents and producing higher magnetic fields while remaining in a superconductive state than the other solid solutions.

The curve of FIG. 3 demonstrates that the material is a Type II superconductor. In a Type I superconductor, there is a proportionality between the magnetization and the applied magnetic field for all fields up to the critical field $H_c$ at which superconductivity in the material is destroyed. Such a material, when in a superconductive state, expels applied fields as long as the applied field is below critical. The penetration of the applied field is restricted to the outer surface of the superconductive material. This is known as the Meissner effect. A Type II superconductor is characterized by two critical fields, $H_{c1}$ and $H_{c2}$. It is similar to a Type I superconductor in that for applied fields from zero to the first critical field $H_{c1}$, there is a proportionality between magnetization and applied fields. When, however, the lower critical field $H_{c1}$ is exceeded, the magnetization is no longer proportional to the applied field, and actually falls off gradually towards zero. The material, however, remains superconductive until the upper critical field $H_{c2}$ is exceeded. This type of superconductor, which does not exhibit the Meissner effect, between $H_{c1}$ and $H_{c2}$, has been found extremely useful in high field superconducting magnets.

In the plot of FIG. 3, the lower critical field $H_{c1}$ is indicated by the upper and lower peaks at + and −0.2 kilo oersteds. The upper critical field $H_{c2}$ is not shown on the plot, it being in excess of 20 kilo oersteds. However, by extension of the curves, it can be estimated that the upper critical field for the material of FIG. 3 is between 40 and 45 kilo oersteds, which is the point at which the two curves extending to the right or to the left intersect one another. The hysteresis in the magnetic characteristics shown in FIG. 3 is typical of Type II superconductors. The plot is obtained by increasing the applied field to a point above 20 kilo oersteds and then reducing the applied field back towards zero.

The superconductive characteristics, described above with reference to the $Th_3P_4$ type solid solutions containing the elements La and Se, are not restricted to this particular lanthanum chalcogenide. Solid solutions formed of lanthanum and sulphur produce the same type of results. The compound $La_2S_3$ is non superconducting at the lowest temperature measured, but by adding to this compound LaS to form solid solutions including the compounds $La_2S_3$ and the compound $La_3S_4$, superconducting solid solutions are obtained. The highest transition temperature is observed when all of the vacancies in the crystal lattice are filled and the material is then $La_3S_4$. This transition temperature is 6.5° K. Solid solutions of these materials which are not as rich in La exhibit lower transition temperatures.

Figure 4:
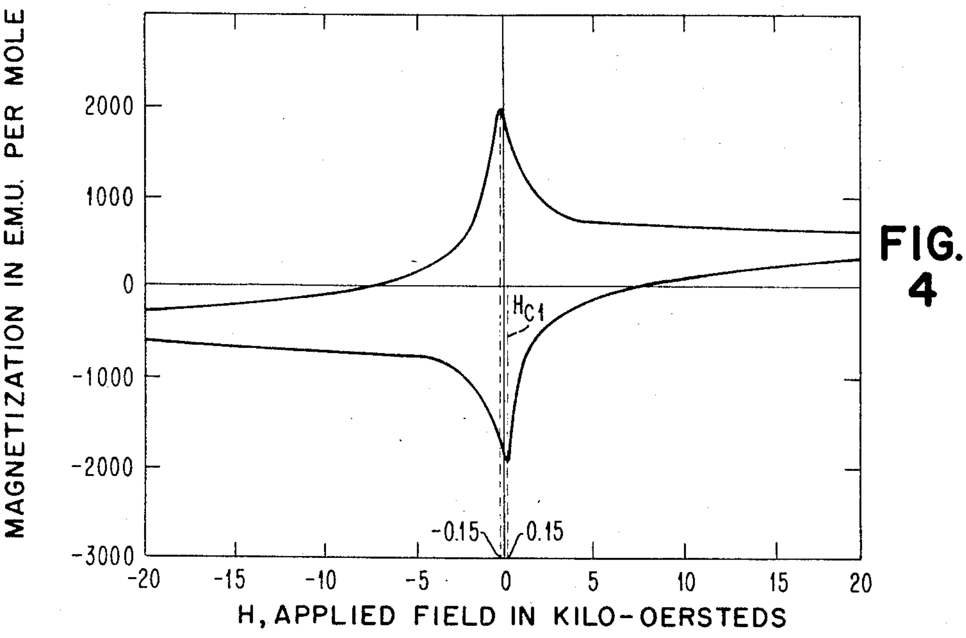
FIG. 4 is a plot exhibiting the magnetic characteristics of the superconductor $La_3S_4$ at 1.3° K.

In the plot of FIG. 4, the magnetic characteristics of a sample of $La_3S_4$ maintained at a temperature of 1.3° K. are shown. Again, the characteristic hysteresis for a Type II superconductor is exhibited. The lower critical field $H_{c1}$ is approximately 0.15 kilo oersted. The asymmetry in the plot of FIG. 4 is due to the fact that the sample measured included a paramagnetic impurity, which produces a powermagnetic moment which is superimposed on the diamagnetic moment of the superconductor changing with the applied field. However, the upper critical field $H_{c2}$ can again be obtained by extending the upper and lower curves till they, intersect at a point in the vicinity of 30 kilo oersteds. This curve demonstrates the manner in which other ions filling at least some of the vacancies, and here present only as a slight impurity, can be used to change the characteristics of a material prepared in accordance with the principles of this invention.

Convenient starting materials for the preparation of solid solutions in the system $La_2Se_3La_3Se_4$ are the 1:1 LaSe and 2:3 or $La_2Se_3$ type chalcogenides. These materials are prepared, as is well known in the art, by the vapor phase reaction of the elements in the appropriate proportions in sealed quartz envelopes which are heated to a maximum temperature of 600° C. In order to insure complete homogeneity of the starting materials, these are subsequently ground and fired in Mo crucibles to 1500° C. for two hours. The resulting sintered ingots are ground in a dry inert atmosphere and then thoroughly mixed in the proper proportions to yield the required concentration in the solid solution system.

As an example, one mole of LaSe is mixed with one mole of $La_2Se_3$ to prepare $La_3Se_4$, the powdered mixture being constantly protected from oxygen and moisture by carrying out all operations in a helium-purged dry box. The mixture is then pressed into a pellet and placed in a molybdenum crucible, which is then sealed. The molybdenum crucible is fired in a helium-purged quartz envelope using an induction heater. The sample is slowly heated to 1200° C. and held for a half hour, and then raised to 1800° C. for the Se, S or 1500° C. for the Te compounds. This temperature is maintained for three hours and then slowly lowered to room temperature. The products of the reactions are dense ingots which become more brittle as the concentration approaches the 2:3 composition. The same method is used to prepare the solid solutions in the system $La_2S_3$ and $La_3S_4$. It is, of course, undersood that the practice of the invention is not limited to solid solutions or compounds formed by this particular method.

From the above, it can be seen that in accordance with the principles of this invention, new and extremely useful superconducting compounds and solid solutions are provided. These compounds and solid solutions exhibit characteristics which are useful in themselves and further, have the unusual property that by the addition of further ions, the conductive, superconductive and magnetic properties can be changed to provide a material having the properties required for a particular application. For example, any one of the solid solutions in the LaSe system including the compound $La_3Se_4$, whose transition temperatures are shown in FIG. 2, can be formed and to it added $La_3S_4$ to form a material with different characteristics.

While the invention has been particularly shown and described with reference to preferred embodiments thereof, it will be understood by those skilled in the art that various changes in form and details may be made therein without departing from the spirit and scope of the invention.

What is claimed is:

1. The method of operating a superconductive device at a particular temperature using a lanthanum chalcogenide superconductive component whose superconductive characteristics are necessary to the operation of the device, said lanthanum chalcogenide being one which exhibits superconductive characteristics when at least a predetermined number of the metal ion sites in the material are occupied by lanthanum ions, and the characteristics of the lanthanum chalcogenide varying with the number of metal ions sites above said predetermined number which are occupied by lanthanum ions; said method comprising the steps of:

(a) applying a current to said component consisting essentially of one of said lanthanum chalcogenides that has a sufficient number of the metal ion sites occupied with lanthanum to impart to said component the superconductive characteristics necessary to the operation of said device at said particular temperature;

(b) and maintaining said component at said particular temperature.

2. The method of claim 1 wherein said lanthanum chalcogenide is a lanthanum selenide.

3. The method of claim 2 wherein said lanthanum selenide is $La_3Se_4$.

4. The method of claim 1 wherein said lanthanum chalcogenide is a lanthanum sulfide.

5. The method of claim 4 wherein said lanthanum sulfide is $La_3S_4$.

6. The method of claim 5 wherein said device is a superconducting high field magnet and said component is a coil for said magnet.

7. The method of claim 1 wherein said component is a superconductive switching circuit.

8. The method of operating a device which depends for its operation upon the superconductive characteristics of at least one of the components of the device comprising the steps of:

(a) applying a current to said device which produces a magnetic field in the vicinity of a component comprising a lanthanum chalcogenide which exhibits superconductive characteristics below a critical temperature;

(b) and maintaining said component at a temperature below said critical temperature whereby said component remains superconductive as long as the applied field is less than the critical field necessary to quench superconductivity in the component at said particular temperature.

References Cited

UNITED STATES PATENTS 3,025,416 3/1962 Johnson ----------- 307—88.5

OTHER REFERENCES

Chemical Abstracts, vol. 62, col. 2487.

LEON D. ROSDOL, *Primary Examiner.*

J. D. WELSH, *Assistant Examiner.*